United States Patent
Peng

(10) Patent No.: US 9,298,865 B1
(45) Date of Patent: Mar. 29, 2016

(54) DEBUGGING AN OPTIMIZED DESIGN IMPLEMENTED IN A DEVICE WITH A PRE-OPTIMIZED DESIGN SIMULATION

(71) Applicant: Altera Corporation, San Jose, CA (US)

(72) Inventor: Yi Peng, Newark, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/220,926

(22) Filed: Mar. 20, 2014

(51) Int. Cl.
*G06F 17/50* (2006.01)
(52) U.S. Cl.
CPC .................................. *G06F 17/5022* (2013.01)
(58) Field of Classification Search
CPC .............. G06F 17/5002; G06F 17/504; G06F 17/5036; G06F 17/5081; G06F 17/5045; G06F 17/5068; G06F 17/5077; G06F 17/505; G06F 17/50; G06F 11/27; H05K 3/0005; G01R 31/318533
USPC .......... 716/106, 111, 112, 113, 114, 134, 136
See application file for complete search history.

(56) References Cited

U.S. PATENT DOCUMENTS

2011/0276850 A1* 11/2011 Luu et al. ...................... 714/733

\* cited by examiner

*Primary Examiner* — Vuthe Siek
(74) *Attorney, Agent, or Firm* — Weaver Austin Villeneuve & Sampson LLP

(57) ABSTRACT

Techniques and mechanisms debug a device implementing an optimized design using a pre-optimized design simulation. For example, data indicating interconnect in a pre-optimized design to simulate may be received. A node in common between the pre-optimized design and an optimized design may be identified. A tap at the output of the node in the optimized design may be inserted for providing data for the simulation.

22 Claims, 14 Drawing Sheets

US 9,298,865 B1

DEBUGGING AN OPTIMIZED DESIGN IMPLEMENTED IN A DEVICE WITH A PRE-OPTIMIZED DESIGN SIMULATION

TECHNICAL FIELD

This disclosure generally relates to integrated circuits. More specifically, the disclosure relates to systems and methods for debugging a device implementing an optimized design using a simulation of a pre-optimized design.

DESCRIPTION OF THE RELATED TECHNOLOGY

A programmable logic device (PLD) is a semiconductor integrated circuit which contains logic circuitry and routing that may be configured to perform a host of logic functions. In a typical scenario, a designer uses electronic design automation (EDA) software tools to create a design. These software tools use information regarding the hardware capabilities of a given programmable logic device to help the designer implement the custom logic using multiple resources available on that given programmable logic device.

In some scenarios, a designer of a PLD may wish to debug a design implemented in the PLD. For instance, a functional failure may be detected, such as an output providing incorrect data. Accordingly, the designer may wish to isolate the source of the functional failure to a particular interconnect or logic.

SUMMARY

The subject matter described herein provides a technique for debugging a device implementing an optimized post-synthesis design using a simulation of a pre-optimized design.

In some scenarios, a designer may create a design to be implemented in a programmable logic device (PLD). For example, behavior of a logic design may be described in a hardware description language (HDL). The HDL describing the behavior of the logic design may be synthesized into a netlist providing the connectivity of the various components of the logic design described in HDL. The synthesized netlist may be optimized through a variety of techniques, such as combining the functionalities of several logic gates into a smaller number of logic gates. Additionally, elements of the optimized logic design may be mapped to resources on the PLD.

After configuring the PLD, the designer may wish to debug the logic design. For instance, a functional failure may be detected, such as an output providing incorrect data. Accordingly, the designer may wish to isolate the source of the functional failure to a particular interconnect or logic. If a particular interconnect is to be sampled to isolate a functional failure, a logic design may be modified to "tap" the interconnect and allow the designer to observe the state of the signal associated with the interconnect. However, the designer may be more familiar with the logic design as described by the HDL rather than the logic design produced through the optimization of the synthesized design. For example, the optimized design may be missing interconnect in the HDL design because logic has been combined during the post-synthesis optimization. Accordingly, the designer may not be fully familiar with the optimized post-synthesis design, and therefore, may have difficulty determining interconnect to tap. Additionally, if implemented in a PLD, the optimized post-synthesis design may be mapped to various resources within the PLD, and therefore, be further translated away from the original design described in the HDL. Moreover, certain interconnect in the synthesized design may be inaccessible based on how the design is mapped to the resources within the PLD.

Allowing the designer to debug the design configured in the PLD based on the pre-optimized design may be advantageous. For example, the designer may be more familiar with the pre-optimized design, and therefore, may be able to debug the functional failure easier.

These and other features will be presented in more detail in the following specification and the accompanying figures, which illustrate by way of example.

DETAILED DESCRIPTION OF PARTICULAR EMBODIMENTS

Figure 1:
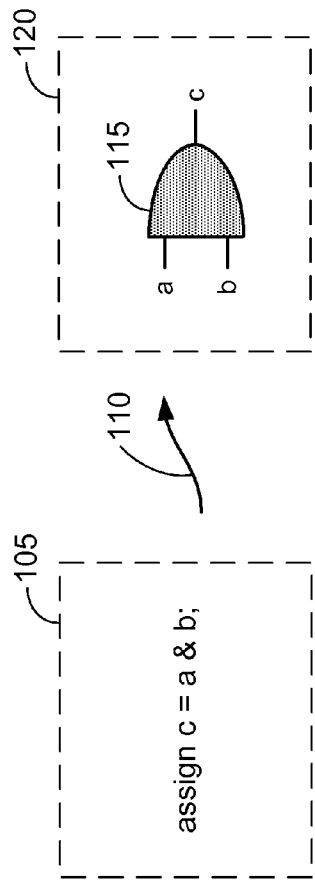
FIG. 1 illustrates an example of logic synthesized from a hardware description language (HDL) design in accordance with some implementations.

FIG. 1 illustrates an example of logic synthesized from a hardware description language (HDL) design in accordance with some implementations. In the implementation of FIG. 1, design flow 100 visualizes synthesizing design 105 implemented in a hardware description language (HDL), such as Verilog, into an implementation including logic gates and other circuit elements.

For example, in FIG. 1, design 105 is implemented in Verilog and describes functionality, or behavior, to be implemented in a circuit. The HDL in design 105 may describe a behavioral model of a circuit. In FIG. 1, C is a result of an AND operation associated with A and B. Though the example of FIG. 1 is using Verilog, any other HDL may be used to describe the behavior of logic. For example, VHDL may also be used.

In FIG. 1, design 105 implemented in Verilog may be synthesized 110 to create synthesized design 120. In some implementations, synthesized design 120 may be implemented in a netlist (e.g., in electronic design interchange format (EDIF), structural HDL, etc.) describing a structural model of the circuit. For example, connectivity (i.e., inputs and outputs) of each circuit element (e.g., logic gates, registers, etc.) may be described. That is, synthesized design 120 may be a structural model of design 105. The circuit elements in synthesized design 120 may implement the behavior described in design 105.

In FIG. 1, synthesized design 120 visualizes the netlist providing an implementation of logic gates that provide the functionality described in design 105. For example, in FIG. 1, the HDL of design 105 is implemented in synthesized design 120 as AND gate 115 with an output of interconnect C and inputs of interconnect A and B. Accordingly, synthesis 110 may implement an HDL design as a structural collection of logic gates and other circuit elements (e.g., registers, I/Os, etc.) that may provide the functionality, or behavior, described in the HDL.

Figure 2A:
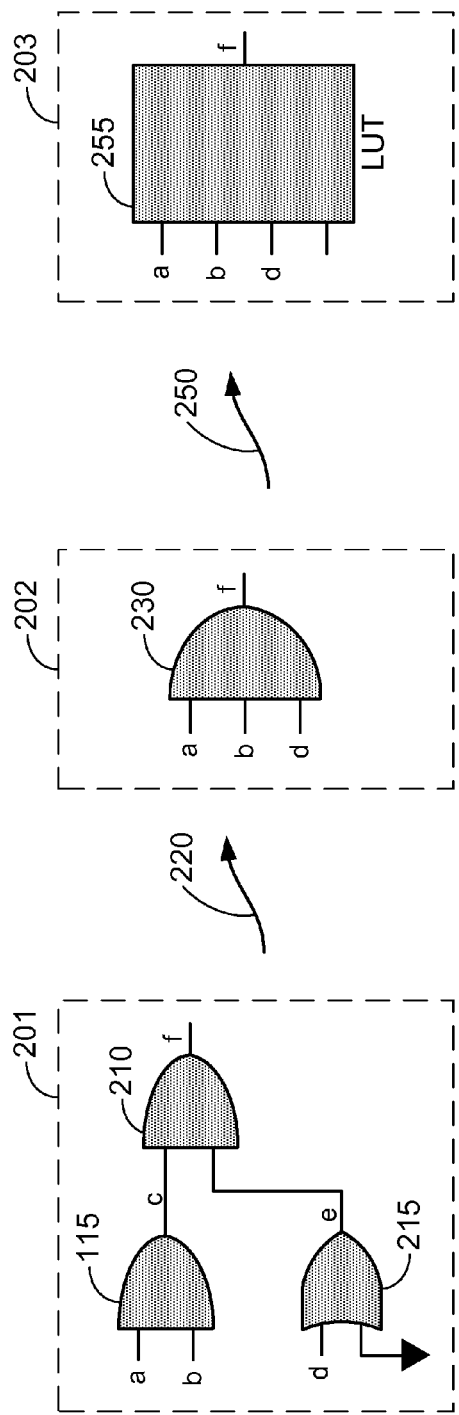
FIG. 2A illustrates an example of synthesized logic being optimized and mapped to a resource in a programmable logic device (PLD) in accordance with some implementations.

FIG. 2A illustrates an example of synthesized logic being optimized and mapped to a resource in a programmable logic device (PLD) (e.g., a field programmable gate array (FPGA), structured ASIC, complex programmable logic device (CPLD), etc.) in accordance with some implementations. In the implementation of FIG. 2A, design 201 may be the result of logic synthesized from an HDL, as previously discussed with respect to FIG. 1. Design 201 includes AND gate 115, AND gate 210, and OR gate 215. AND gate 115 includes inputs from interconnect A and interconnect B. OR gate 215 includes an input from interconnect D. A second input in OR gate 215 is coupled with ground (e.g., 0 V). Interconnect C is an output of AND gate 115 and interconnect E is an output of OR gate 215. Interconnect C and interconnect E are inputs to AND gate 210. Interconnect F is an output of AND gate 210.

Design 201 may be modified, for example via optimized 220, to create optimized design 202. That is, logic in design 201 may be changed to a different logic design in optimized design 202 providing the same functionality with a different collection and/or arrangement of circuit elements. For example, in design 201, an input of OR gate 215 is coupled with ground, and therefore, interconnect E (i.e., the output of OR gate 215) is provided the signal of interconnect D (i.e., the other input of OR gate 215). As such, OR gate 215 may be removed because interconnect E will have the same signal as interconnect D. Effectively, interconnect D may be provided as an input to AND gate 210. Additionally, two-input gates AND gate 115 and AND gate 210 may be combined as a three-input AND gate providing the same functionality. Accordingly, optimized design 202 may include a single three-input AND gate 230 having inputs interconnect A, interconnect B, and interconnect D and an output interconnect F. The three-input AND gate 230 in optimized design 202 provides the same functionality of the arrangement of logic and interconnect in design 201, but reduces the number of logic gates and interconnect by combining the functionalities of several logic gates into a smaller number of logic gates. In some implementations, optimized design 202 may use less area on a die and/or less resources of a device. A design may be optimized to different levels of optimization (e.g., maximum optimization, minimal optimization, or any level of optimization in between).

In some implementations, synthesis 110 and optimization 220 may be performed in the same operation. For example, when logic is synthesized, it is also optimized.

Figure 2B:
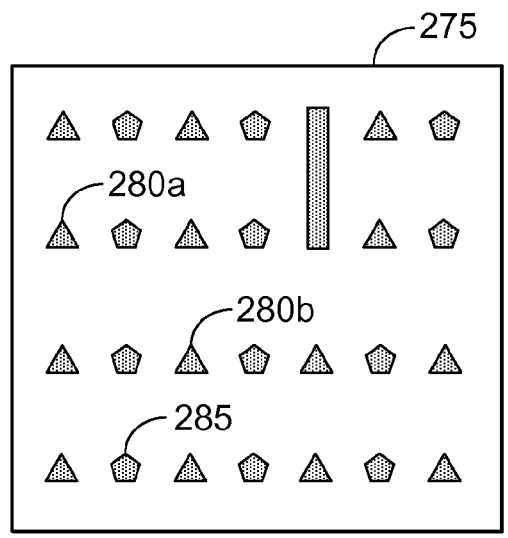
FIG. 2B illustrates a simplified example of resources in a PLD in accordance with some implementations.

Additionally, in a PLD, logic may be mapped, or placed, to particular resources within the PLD. That is, a design may be further modified to be mapped to resources within the PLD. FIG. 2B illustrates a simplified example of resources in a PLD in accordance with some implementations. PLD 275 may include a variety of different types of resources. For example, in FIG. 2B, three different resource types are shown: a first resource type associated with resources 280a and 280b, a second resource type associated with resource 285, and third resource type associated with resource 290. The resource types may be distributed throughout PLD 275. For example, resource 280a is the same resource type as resource 280b, but located in a different location in PLD 275. Different types of circuit elements may be mapped to different resource types. For example, combinational logic may be mapped to the first resource type associated with resources 280a and 280b. Accordingly, resources 280a and 280b may be configured to provide a particular functionality in combinational logic. However, other circuit elements may be mapped to other types of resources. As an example, a register may be mapped to resource type 285. In some implementations, resource type 285 may be a register itself, and therefore, a register in optimized design 202 may be mapped to a register in PLD 275.

Accordingly, optimized design 202 may be mapped 250 to create mapped design 203. That is, elements in optimized design 202 may be mapped to particular resource types and locations within PLD 275 providing the same functionality with resources provided by PLD 275. For example, AND gate 230 in optimized design 202 may be mapped to lookup table (LUT) 255 in mapped design 203. LUT 255 may be, for example, resource 280a in PLD 275 of FIG. 2B. LUT 255 includes four inputs. Three inputs are associated with interconnect A, interconnect B, and interconnect D. An output of LUT 255 may provide interconnect F. The behavior of LUT 255 may be determined, for example, by configuring configuration elements, such as configuration random access memory (CRAM) bits, such that LUT 255 may provide a particular functionality (e.g., a three-input AND gate). In other implementations, a resource may provide a particular functionality by configuring or programming, antifuses, fuses, flash memory, etc. Thus, LUT 255 may be configured to provide the functionality of AND gate 230. The placement of AND gate 230 in association with LUT 255 (e.g., resource 280a) may also include routing various interconnect (e.g., inputs and outputs) between other resources and LUT 255. The routing may also be provided by configuring configuration elements.

After elements of a logic design have been placed and interconnect routed, for example in an EDA software tool, a configuration file, or bitstream, describing the settings of the configuration elements may be generated and loaded onto a device, and therefore, configure the device to provide the functionality of the logic design. As such, an optimized logic design may be implemented within the PLD. The synthesis, optimization, placement and routing, and bitstream generation, as well as any other process steps in between, may be performed by an electronic design automation (EDA) software tool.

Accordingly, a behavioral HDL design may be synthesized to a structural netlist describing a logic design. The structural netlist may be optimized to create an optimized logic design. Moreover, the elements of the optimized logic design may be mapped to resources within the device. That is, several related, but modified, designs may be created, or generated. A configuration file may implement the optimized and mapped logic design in the PLD. As such, the functionality described in the HDL may be implemented within a PLD.

In some scenarios, a designer may wish to debug the design. For instance, a functional failure may be detected, such as an output providing incorrect data. Accordingly, the designer may wish to isolate the source of the functional failure to a particular interconnect or logic. If a particular interconnect is to be sampled to isolate a functional failure, a design may be modified to "tap" the interconnect and allow the designer to observe the state of the signal (e.g. a value of "1" or "0") associated with the interconnect.

Figure 3:
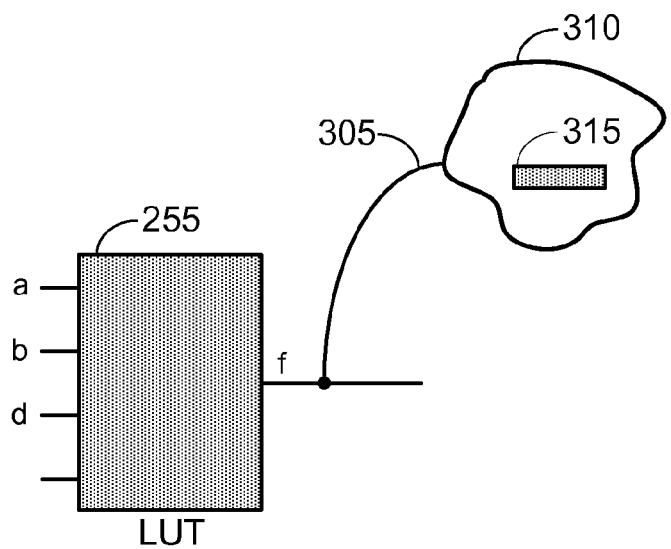
FIG. 3 illustrates an example of tapping an output of a lookup table (LUT) of a PLD in accordance with some implementations.

FIG. 3 illustrates an example of tapping an output of a LUT of a PLD in accordance with some implementations. In FIG. 3, inputs and an output of LUT 255 may be "tapped" and provided to debug logic 310. Debug logic 310 may include logic analyzer 315. Logic analyzer 315 may be provided signals from a design and store data regarding the signals. The data may be stored in on-chip or off-chip memory. In some implementations, logic analyzer 315 may be triggered based on trigger conditions associated with the state of the interconnect it is monitoring. When triggered, a "snapshot" of the signals before and after the trigger condition may be provided, for example, to a computer for display on a graphical user interface (GUI) of an EDA software program via a Joint Test Action Group (JTAG) interface which may be implemented in debug logic 310. In some implementations, debug logic 310 may be configured in the PLD (e.g., configured in soft logic). In other implementations, debug logic 310 may be hardwired in hard logic. In some implementations, parts of debug logic 310 may be split between hard logic and soft logic. For example, logic analyzer 315 may be configured in soft logic and other parts of debug logic 310 may be implemented in hard logic, and vice versa.

The elements of an optimized logic design may be mapped to particular resources, as previously discussed in reference to FIG. 2B. In particular, since the design has been mapped, or placed, to resources within PLD 275, and routing of interconnect between the resources has been configured, an additional routing of a tapping interconnect may be configured in the PLD without disturbing the placement of circuit elements and routing of other interconnect. In FIG. 3, interconnect 305 may be added (e.g., by configuring configuration elements to implement interconnect 305) to "tap" the output of LUT 255 (i.e., interconnect F). As such, interconnect 305 may be added to the design after all other elements have been mapped, or placed, and interconnect routed. Accordingly, interconnect 305 may be added without the entire logic design undergoing synthesis, optimization, and mapping again. Rather, only interconnect 305 and/or debug logic 310 may need to be added to the post-mapping design (e.g., mapped design 203) and then new configuration data (e.g., a bitstream) may be generated to program a device to include interconnect 305 with the rest of mapped design 203 such that the debugging process may begin. One or multiple interconnect may be tapped. When a new set of interconnects is selected to be tapped, the procedure may be repeated with the new taps and the old taps may be removed. Since synthesis, optimization, and mapping may take significant time, avoiding repeating the entire process for the entire logic design may allow for significantly faster debugging. For example, some large logic designs may take hours to go through the entire synthesis, optimization, mapping, and bitstream generation process.

However, in FIG. 3, some interconnect from the original HDL design may not be tapped. In the implementation in FIG. 3, only inputs and outputs of LUT 255 may be tapped. Internal interconnect within LUT 255 may not be accessible to debug logic 310. For example, in FIG. 2A, logic design 201 includes interconnect C. However, after optimization 220, optimized design 202 reduces logic design 201 to AND gate 230. That is, the logic gates in logic design 201 have been transformed to a single three-input AND gate 230 with inputs including interconnect A, interconnect B, and interconnect D and an output of interconnect F. Interconnect C is not an input or output to AND gate 230. Rather, the equivalent interconnect is internal to AND gate 230. AND gate 230 is mapped 250 to a LUT 255, and therefore, functionality of interconnect C may not be tapped because it is internal to LUT 255.

However, the designer may be more familiar with the design as described by the HDL rather than the design produced through the optimization of the synthesized design or the mapped design. As discussed above, the optimized design may be missing interconnect in the HDL design because logic has been combined during the post-synthesis optimization. Accordingly, the designer may not be fully familiar with the optimized post-synthesis design, and therefore, may have difficulty determining the interconnect to tap. Additionally, if implemented in a PLD, the optimized post-synthesis design may be mapped to various resources within the PLD, and therefore, further translated away from the original design described in the HDL. Moreover, the names of the interconnect for the optimized design and mapped design in the EDA software may be different than the names the designer used in the HDL.

Figure 4:
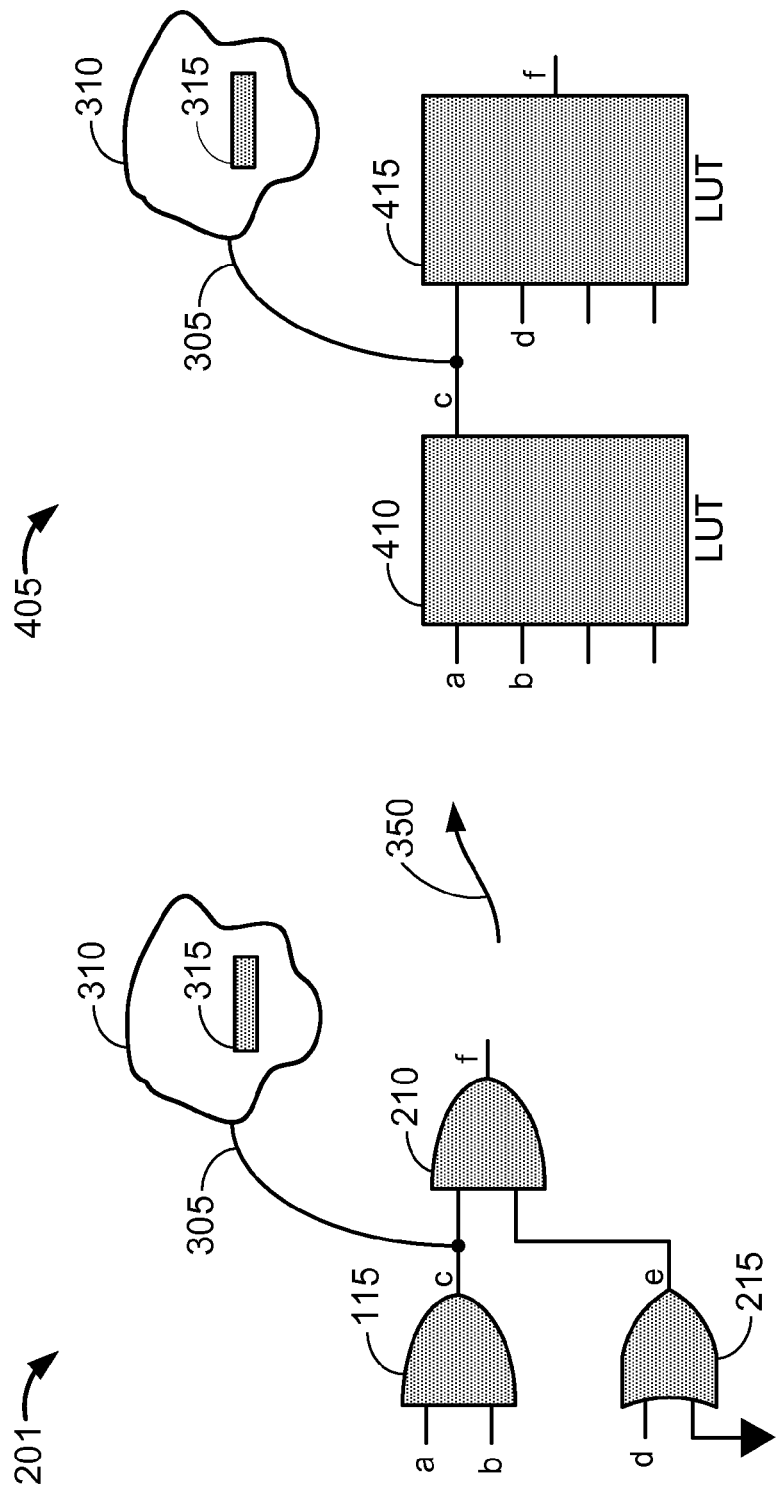
FIG. 4 illustrates an example of preserving an accessible interconnect during post-synthesis optimization and mapping in accordance with some implementations.

FIG. 4 illustrates an example of maintaining an accessible interconnect during post-synthesis optimization and mapping in accordance with some implementations. In FIG. 4, a designer may specify, for example in electronic design automation (EDA) software, that interconnect C of logic design 201 may be tapped. Accordingly, interconnect C may be preserved in mapped design 405. For example, in FIG. 4, mapped design 405 includes LUT 410 and LUT 415 configured to implement the functionality of logic design 201. Additionally, because logic design 201 is implemented across two LUTs, interconnect C is an output of LUT 410 and an input to LUT 415, and therefore, may be tapped to be coupled with debug logic 310 via interconnect 305. That is, because interconnect C is no longer internal to a LUT, it may be tapped.

As such, the interconnect as described in the HDL or provided in the synthesized design may be preserved, and therefore, the designer may be more familiar with the design when debugging. However, the implementation of FIG. 4 may take more resources. For example, in FIG. 4, logic design 201 is mapped to two LUTs. In the example of FIG. 2A, the same logic design 201 is mapped to a single LUT. Additionally, certain failure conditions may disappear if two LUTs are used because timing characteristics of the design may change. For example, a failure may no longer appear because the implementation of two LUTs provides slower circuit performance than the implementation of a single LUT, and therefore, the designer may not be able to properly debug the design.

Figure 5:
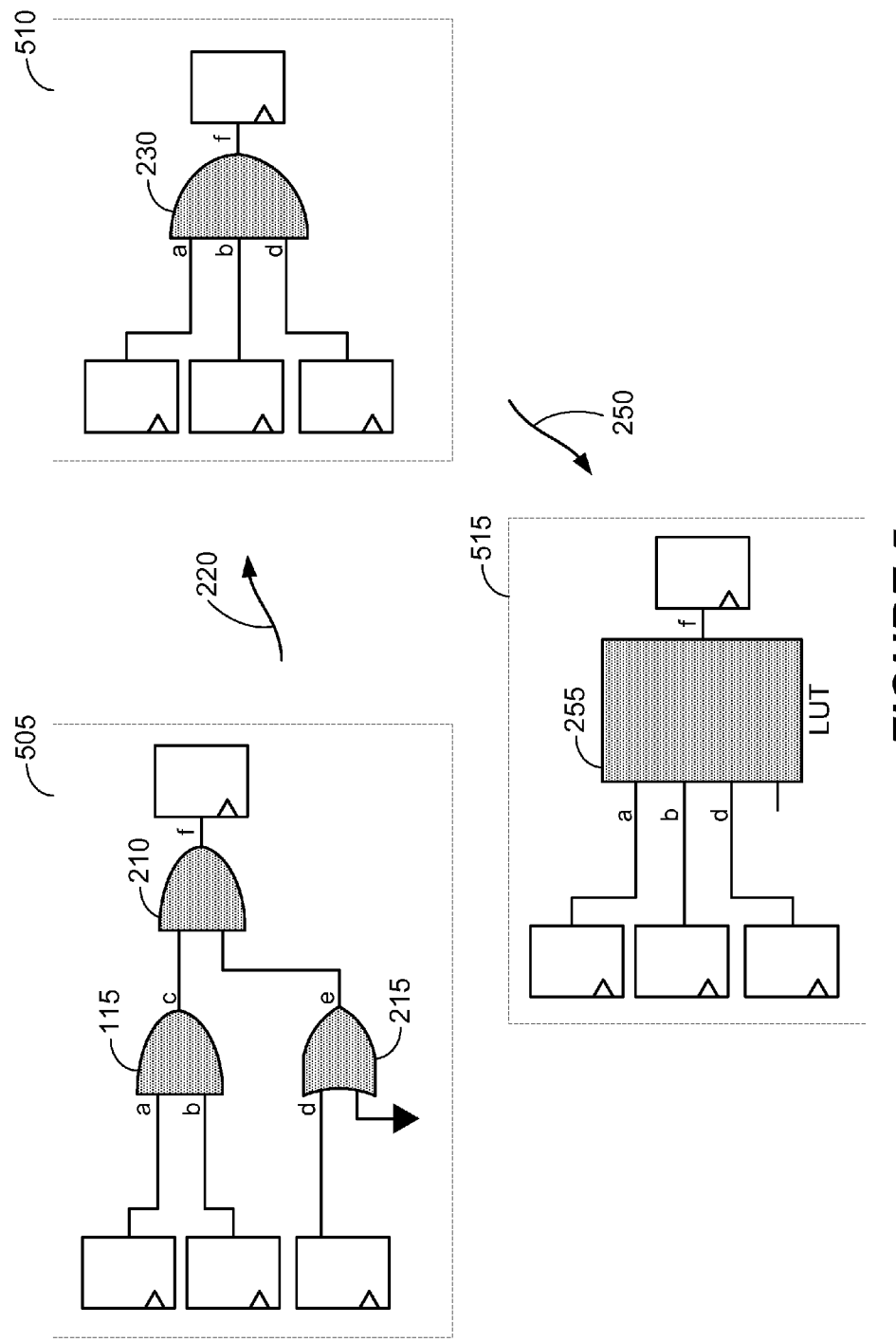
FIG. 5 illustrates an example of registers preserved during post-synthesis optimization and mapping in accordance with some implementations.

FIG. 5 illustrates an example of registers preserved during post-synthesis optimization and mapping in accordance with some implementations. In some implementations, certain circuit elements may be "keypoint" nodes that may be preserved during the post-synthesis optimization and mapping process. For example, most registers may map to registers in the mapped design. That is, registers in the synthesized design may still exist as registers in the optimized design and mapped to registers in the mapped design. Combinational logic may be optimized, for example, by being reduced, or combined, and then mapped to LUTs, as previously discussed. Accordingly, the transformation of registers between the synthesized design, optimized design, and mapped design may be known from the beginning of the design process.

As an example, in FIG. 5, synthesized logic design 505 may include combinational logic including AND gate 115, OR gate 210, and OR gate 215 with inputs coupled with outputs of registers and interconnect F (i.e., the output of the combinational logic) coupled with another register. Synthesized logic design 220 may be optimized 220 to generate optimized design 510. In optimized design 510, the combinational logic may be transformed into a single AND gate 230, as previously discussed in reference to FIG. 2A. However, each of the registers is preserved. That is, the registers are not reduced or combined; they are undisturbed during optimization 220. In mapping 250, mapped design 515 may be generated, and AND gate 230 may be mapped to LUT 255, which may be a resource and resource type such as resource 280*a*. However, the registers may be mapped to register resource types. For example, in PLD 275 of FIG. 2B, resource 285 may be a register, and therefore, a register in optimized logic design 510 may be implemented in resource 285. Accordingly, the registers are preserved in between synthesized logic design 505, optimized logic design 510, and mapped logic design 515. Since the registers are preserved, the outputs and inputs of the registers may be accessible because each register is mapped to a register resource type with inputs and outputs accessible to debug logic 310. For example, in mapped logic design 515, each of interconnect A, interconnect B, interconnect D, and interconnect F may be accessible to debug logic 310.

Though FIG. 5 shows logic being between keypoint nodes mapped to a single LUT, in other implementations, logic between keypoint nodes may be mapped to multiple LUTs or resources of the PLD.

In some implementations, hard IP blocks may also be keypoint nodes that are preserved during the design flow (i.e., post-synthesis optimization, mapping, etc.). Hard IP blocks may be hardwired functionality within a device, such as Inputs/Outputs (I/Os), memories, digital signal processing (DSP) blocks, etc.

Figure 6A:
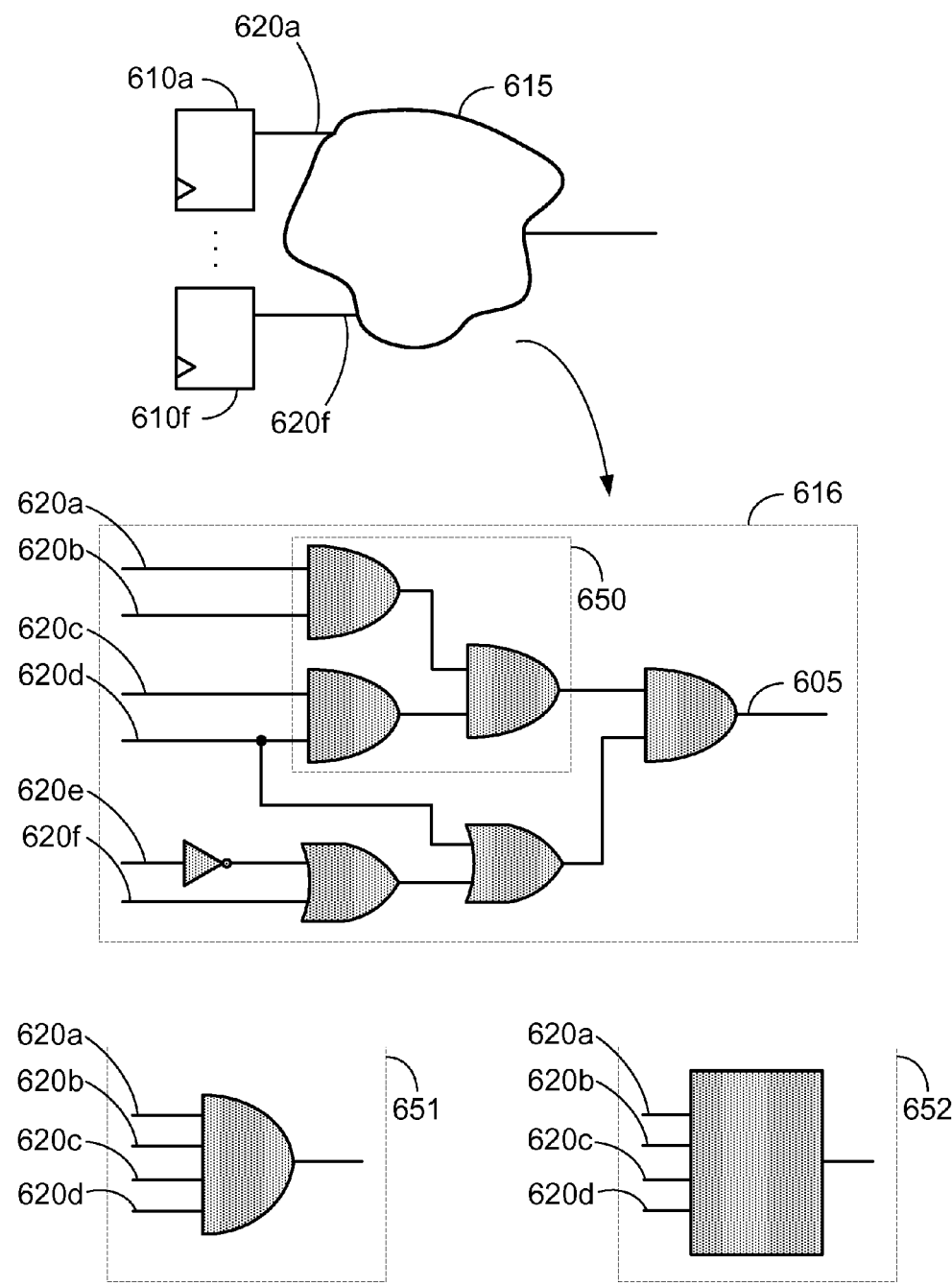
FIG. 6A illustrates an example of preserved registers in a post-optimization design driving combinational logic in accordance with some implementations.

FIG. 6A illustrates an example of preserved registers in a post-optimization design driving combinational logic in accordance with some implementations. In FIG. 6A, interconnect within combinational logic block 615 of a pre-optimized design may be indicated (e.g., by a designer debugging the design with EDA software) to be tapped and sampled. However, as previously discussed, interconnect may not be accessible in a post-optimization or post-mapping design. That is, in the design implemented within the PLD, the indicated interconnect in the pre-optimized design may not be accessible in the post-optimized or post-mapping designs implemented in the PLD. However, in FIG. 6A, the outputs of keypoint nodes (i.e., registers 610*a*-610*f*) driving combinational logic block 615 may be accessible, and therefore, tapped to provide data to debug logic 310. In an implementation, the tapped data from the outputs (i.e., interconnect 620*a*-620*f*) may be provided to the EDA software tool which may then simulate the behavior of the pre-optimization design, and therefore, provide simulated data for the inaccessible interconnect within combinational logic block 615.

Accordingly, the outputs of registers 610*a*-610*f* may be tapped in the post-mapping design implemented within the PLD and coupled with debug logic 310. Data from the tapped interconnect 620*a*-620*f* (i.e., the outputs of registers 610*a*-610*f*) may be provided to debug logic 310, and therefore, provided to EDA software, and a simulation of an internal interconnect within the pre-optimized design may be generated. As such, a designer may select an interconnect to debug based on the pre-optimized design that is closer to the designer's understanding of the design, but the actual tapping may be performed at outputs of keypoint nodes at the post-mapping level which may be farther away from the designer's understanding due to optimizing logic and mapping optimized logic to resources within the PLD. The results from interconnect tapped in the post-mapping logic implemented in the PLD may then be used to simulate what the result would be in the pre-optimized design, and therefore, allow the designer to debug the design based on a pre-optimized design.

Accordingly, the PLD may be configured with an optimized and mapped design. Data from the PLD may be provided to the EDA software tool. The data may be used by the EDA software tool to simulate the pre-optimized design, and therefore, provide values of signals associated with interconnect in the pre-optimized design. As such, interconnect in the pre-optimized design may be selected (e.g., an interconnect that is inaccessible in the post-optimized and post-mapped design), but other interconnect in the post-optimized and post-mapped design implemented in the PLD may actually be tapped to provide the data for simulation.

As an example, in FIG. 6A, combinational logic block 615 may be logic that is optimized and placed within the PLD. Pre-optimized combinational logic block 616 may be a pre-optimized and pre-mapped version of combinational logic block 615. That is, pre-optimized combinational logic block 616 may be optimized and mapped to provide combinational logic block 615. A designer may select interconnect 605 in pre-optimized combinational logic block 616 to debug. For example, the designer may be provided a schematic, in EDA software, of the pre-optimized design and select interconnect 605 in the schematic. As another example, the designer may be provided a list of interconnect in the pre-optimized design (e.g., in a hierarchical list of interconnect) and select interconnect 605 from the list. Accordingly, the EDA tool may search for the keypoint nodes (e.g., registers and hard IP blocks) driving the block of combinational logic providing interconnect 605 (i.e., the output of pre-optimized combinational logic block 616) in pre-optimized combinational logic block 616. The output interconnect of the identified keypoint nodes may then be tapped in the post-optimized and post-mapped design implemented in the PLD to provide data for the simulation.

For example, in FIG. 6A, interconnect 620*a*-620*f* are outputs of registers 610*a*-610*f* and driving logic within pre-optimized combinational logic block 616. Though a version of pre-optimized combinational logic design 616 may be optimized and placed as combinational logic block 615, the inputs provided by interconnect 620*a*-620*f* are still provided to the post-optimized and post-mapped combinational logic block 615. That is, the keypoint nodes still provide the same inputs to the post-optimized and post-mapped combinational logic block 615 as pre-optimized combinational logic block 616 despite any alteration of the combinational logic. For example, in FIG. 6A, logic 650 of pre-optimized combinational logic block 616 may include three AND gates with two AND gates receiving inputs from interconnect 620*a*-620*d*. Optimized logic 651 may be an optimized version of logic 650. Optimized logic 651 may be a single four-input AND gate that may be mapped to a single LUT in mapped logic 652. Though the three AND gates in logic 650 are reduced to a single AND gate functionality in optimized logic 651 and mapped to a single LUT in mapped logic 652, the four inputs (i.e., interconnect 620a-620d) from registers 610a-610d are preserved between the different designs and provide the same data and functionality between the different designs. Accordingly, tapping interconnect 620a-620f (i.e., the outputs of the register keypoint nodes) may provide data that may be used to simulate a signal on an interconnect within pre-optimized combinational logic block 616. The simulation may be performed by the EDA software which includes access to all levels of the design (e.g., HDL, post-synthesis, post-optimization, and post-mapping). As such, the EDA tool may receive data from interconnect 620a-620f implemented as the mapped design in the PLD, but may create a simulation based on the design at a different level of abstraction, such as the post-synthesis level before optimization because the received data may be applied to a representation of combinational logic block 616 stored in software, and therefore, the values of all of the interconnect (including interconnect 605) within combinational logic block 616 may be derived. In some implementations, a truth table associated with interconnect in combinational logic block 616 may be created by the EDA software and used to derive the simulated data.

Additionally, any other logic with keypoint nodes resolved to interconnect 620a-620f (i.e., the outputs of the register keypoint nodes) may also be simulated. For example, if the outputs of the first two OR gates in logic 650 (i.e., the outputs of the two OR gates which have inputs associated with interconnect 620a-620d) are provided to another gate, for example another OR gate, the output of the other OR gate may also be determined and/or simulated because it requires tapping interconnect 620a-620d, which are also required to tap interconnect 605. Any logic that may be resolved to keypoint nodes that are already associated with other logic may be simulated. Accordingly, if one interconnect is to be simulated, a second interconnect may be selected to be simulated if it is determined that the other interconnect is associated with the same or a subset of keypoint nodes. As such, the keypoint nodes may be tapped once to gather data and may be used to simulate a wide variety of interconnect if they share the same keypoint nodes. For example, an interconnect with four keypoint nodes may require the four keypoint nodes to be tapped. Another node may be resolved to two of the four keypoint nodes, and therefore may be simulated based on the tapping of the four keypoint nodes.

Figure 6B:
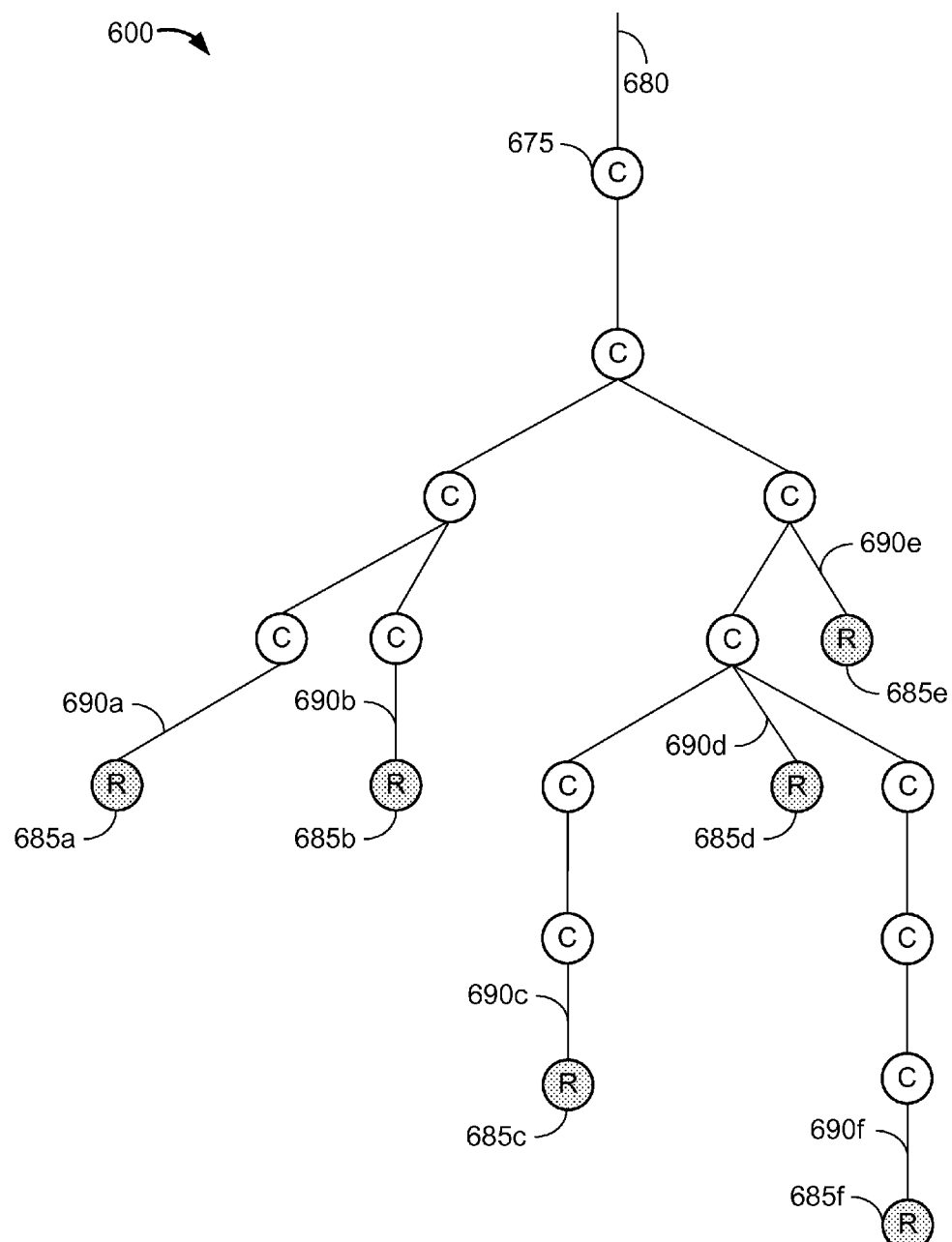
FIG. 6B illustrates an example of a graph associated with pre-optimized logic in accordance with some implementations.

FIG. 6B illustrates an example of a graph associated with pre-optimized logic in accordance with some implementations. In some implementations, graph 600 may be based on a pre-synthesized netlist. In FIG. 6B, nodes of graph 600 may represent the circuit elements and arcs may represent interconnect of a synthesized but pre-optimized logic design. Graph 600 in FIG. 6B has a tree-like structure, but in other implementations, graph 600 may include loops. Graph 600 may be created and searched by an EDA software, for example with a depth first search algorithm, to find the keypoint nodes (e.g., registers) for tapping in a post-mapping design implemented on a PLD for simulating signals on inaccessible interconnect. In some implementations, graph 600 may be created for a synthesized and pre-optimized design.

For example, in FIG. 6B, interconnect 680 may be selected to simulate. Interconnect 680 is driven by node 675. Node 675 is labeled "C" for a node representing combinational logic (e.g., a logic gate). Keypoint nodes 685a-685f are labeled "R" for a node representing a register. Accordingly, each node may represent a circuit element (e.g., logic gates, registers, etc.) and each arc between the nodes may represent interconnect in the design. For example, interconnect 690a-690f are interconnect driven by registers 685a-685f, respectively, and therefore may be tapped to provide data for simulated functionality for any of the interconnect between the tapped interconnect 690a-690f and interconnect 680 (i.e., the output of each C node in graph 600, such as interconnect 680). As such, if interconnect 680 is to be tapped, all of the output interconnect of the fan-in keypoint nodes (i.e., keypoint nodes 685a-685f) for the combinational logic block providing interconnect 680 may be tapped to simulate signals for any of the interconnect in graph 600. As such, keypoint nodes in the pre-synthesized logic design may be identified. Additionally, the identified keypoint nodes in the pre-optimized logic design may translate to keypoint nodes in the post-optimized and post-mapping designs, as previously discussed, because the keypoint nodes correspond to other keypoint nodes in the other designs. Accordingly, a keypoint node may be found at one design and used to find corresponding keypoint nodes in other designs. For example, a pre-synthesis design may be used to find a keypoint node in the post-synthesis design, post-optimization design, and post-fitting design. As another example, a keypoint node in a post-synthesis design may be used to find keypoint nodes in a pre-synthesis design, post-optimization design, and post-fitting design.

Figure 7A:
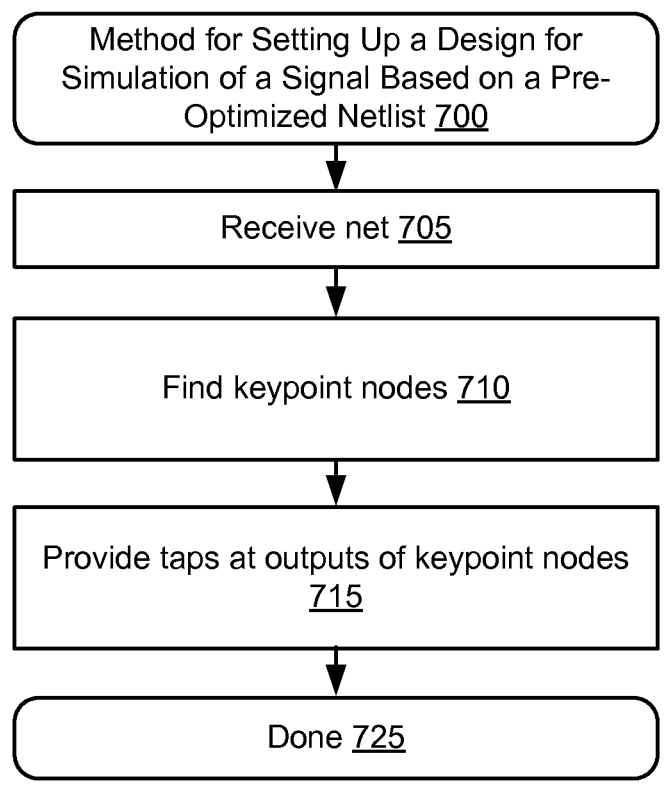
FIG. 7A is a flowchart illustrating a process flow for setting up a design for a simulation of a signal based on pre-optimized logic in accordance with some implementations.

FIG. 7A is a flowchart illustrating a process flow for setting up a design for a simulation of a signal based on pre-optimized logic in accordance with some implementations. In method 700, at block 705, an interconnect may be specified to be simulated. For example, the interconnect may be selected in an EDA software tool. In some implementations, multiple interconnect may be selected. In block 710, the keypoint nodes for the received interconnect may be identified. For example, the preserved nodes (e.g., registers and/or hard logic) between the pre-optimization and post-optimization design may be identified. In block 715, taps may be provided at the outputs of the keypoint nodes. At block 725, method 700 is done.

Figure 7B:
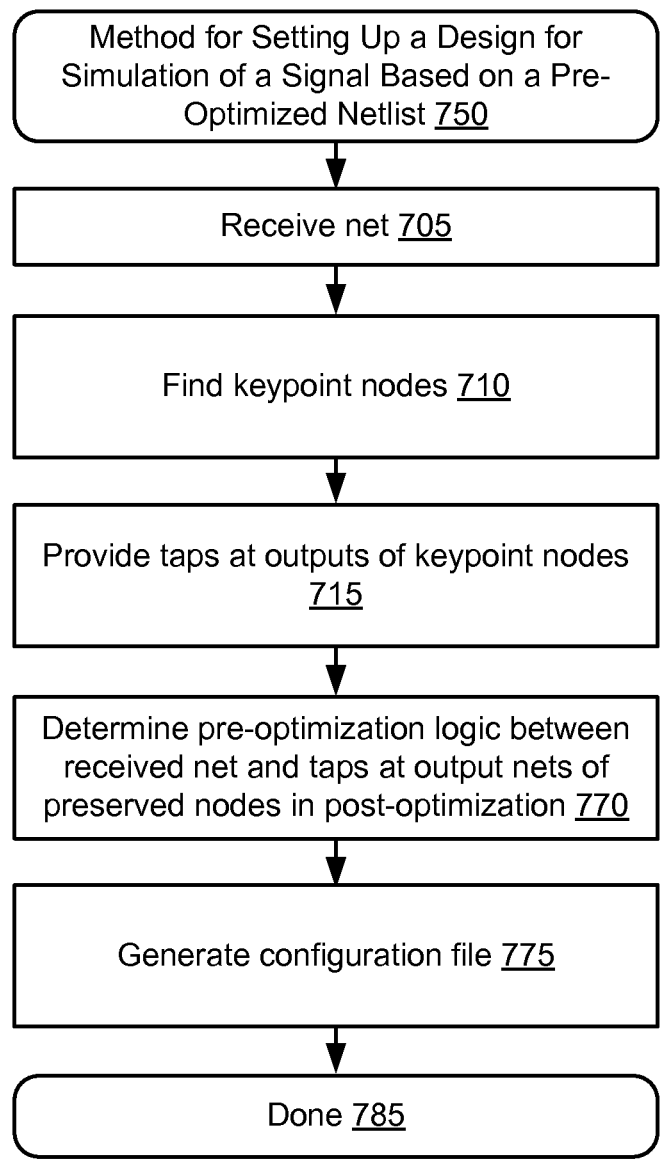
FIG. 7B is another flowchart illustrating a process flow for setting up a design for a simulation of a signal based on pre-optimized logic in accordance with some implementations.

FIG. 7B is another flowchart illustrating a process flow for setting up a design for a simulation of a signal based on pre-optimized logic in accordance with some implementations. In method 750, at block 705, interconnect to be simulated or tapped may be specified. In some implementations, if an interconnect is accessible in the post-mapping design, the interconnect may be tapped. However, if the interconnect cannot be tapped, the keypoint nodes for the inaccessible interconnect may be identified at block 710. At block 715, the appropriate interconnects may be tapped and coupled with debug logic. In block 770, the pre-optimization logic in between the specified interconnect to be simulated and the keypoint node may be determined. For example, a truth table or other derivation method may be created by EDA software to simulate the value (e.g., "1" or "0") for the simulated interconnect based on the data provided by the outputs of the keypoint nodes. In block 775, configuration data for the design with taps at the appropriate interconnects may be generated. Accordingly, the device may be programmed with the debug design and data may be received to simulate the values at the inaccessible interconnects by using the derivation method created at block 770. At block 785, the method is done.

Figure 8:
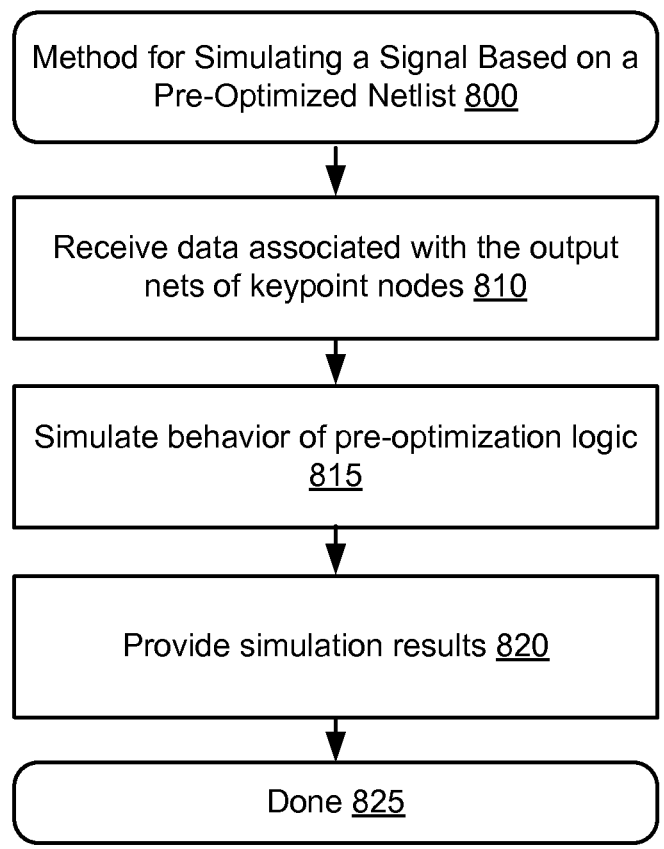
FIG. 8 is a flowchart illustrating a process flow for simulating a signal based on pre-optimized logic in accordance with some implementations.

FIG. 8 is a flowchart illustrating a process flow for simulating a signal based on pre-optimized logic in accordance with some implementations. In method 800, at block 805, data associated with the output of keypoint nodes may be received. At block 815, the behavior of inaccessible interconnect may be simulated based on the data associated with the output of the keypoint nodes. At block 820, simulation results may be provided, for example, in a waveform simulator in the GUI of an EDA software tool. At block 825, the method is done.

Figure 9:
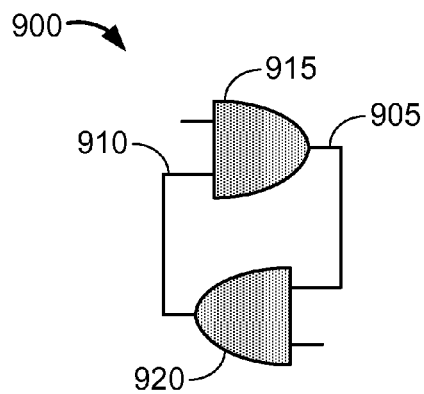
FIG. 9 illustrates an example of a combinational logic loop in accordance with some implementations.

In some implementations, certain combinational logic arrangements may not have keypoint nodes, and therefore, may be opted out of the optimization process so that interconnect may be directly tapped rather than simulating the signal on the interconnect by tapping the interconnect of a keypoint node. FIG. 9 illustrates an example of a combinational logic loop in accordance with some implementations. Combinational loop 900 in FIG. 9 has no keypoint nodes. That is, signals associated with interconnect 905 and interconnect 910 may not be simulated by data from keypoint nodes, such as a register. Accordingly, combinational loops may be identified, for example during the optimization process, and not optimized (e.g., not reduced).

Figure 10:
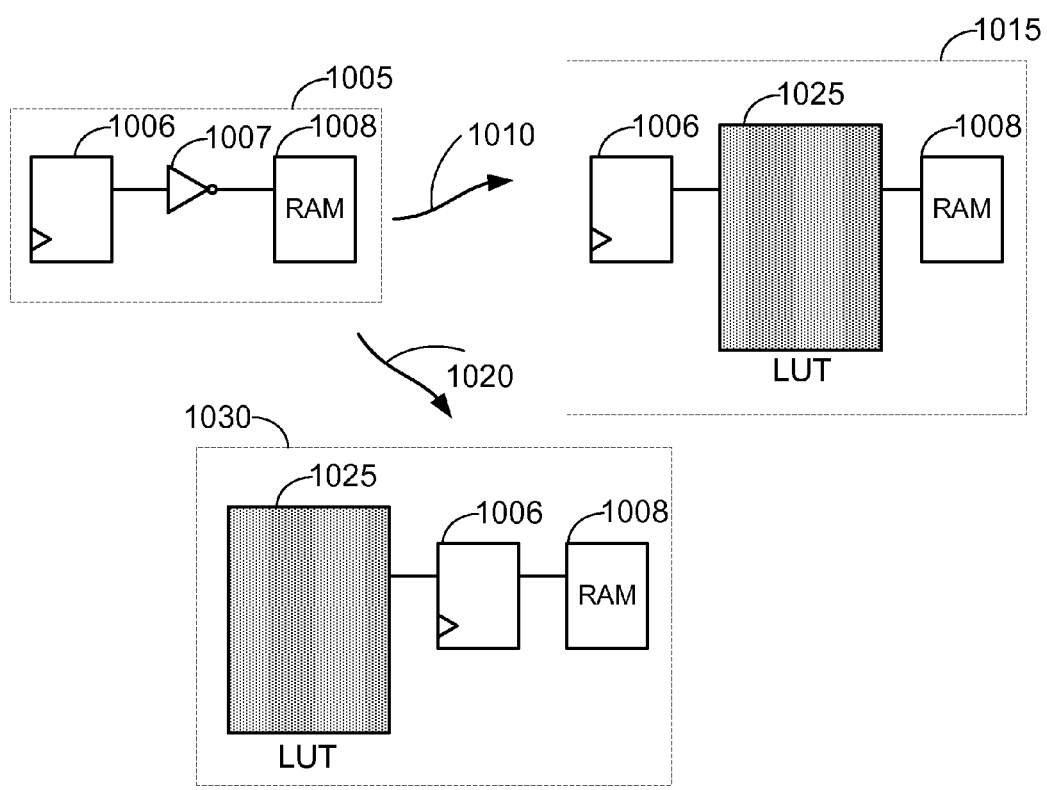
FIG. 10 illustrates an example of an optimization moving combinational logic around a register in accordance with some implementations.

In some implementations, certain combinational logic may move around registers, and therefore, the register may no longer drive a combinational logic block after synthesis and optimization. FIG. 10 illustrates an example of an optimization moving combinational logic around a register in accordance with some implementations. In FIG. 10, design 1005 includes register 1006 driving inverter 1007. The output of inverter 1007 is provided to RAM 1008 (e.g., on-chip memory). In mapping 1010, inverter 1007 may be mapped to LUT 1025. An input of LUT 1025 may be coupled with an output of register 1006. An output of LUT 1025 may be provided to RAM 1008. However, in optimization 1020, the logic for the inverter may be moved before register 1006. For example, the functionality of inverter 1007 may be combined with functionality of logic before register 1006 in design 1005, and therefore, in design 1030, LUT 1025 may incorporate the logic of inverter 1007 in addition to the logic before register 1006 in design 1005. Accordingly, the keypoint nodes for the interconnect provided by the output of inverter 1007 may be simulated based on registers other than register 1006. That is, the registers driving the preceding combinational logic block before register 1006 in design 1005 may be used as keypoint nodes for simulating the output of inverter 1007.

Figure 11:
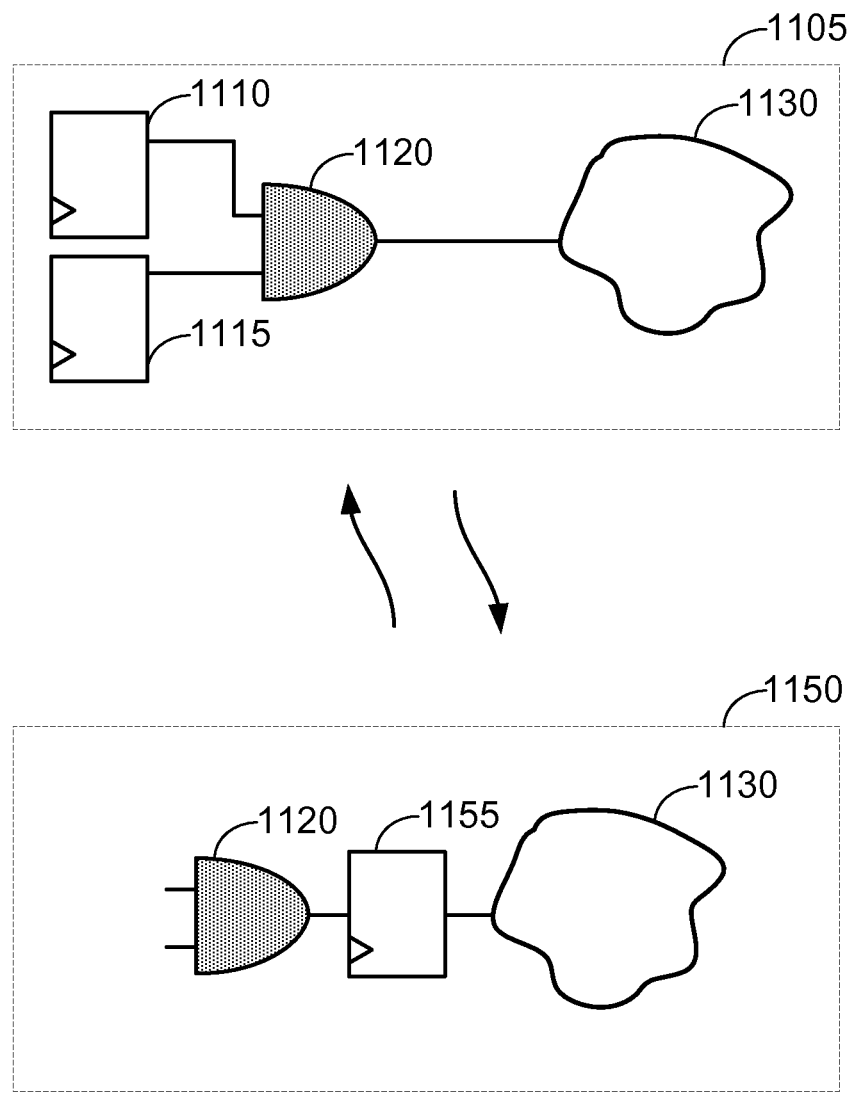
FIG. 11 illustrates an example of a register re-timing optimization in accordance with some implementations.

In some implementations, registers may be moved around combinational logic. FIG. 11 illustrates an example of a register re-timing optimization in accordance with some implementations. In FIG. 11, design 1105 includes register 1110 and register 1115 providing inputs to AND gate 1120. AND gate may further provide an input to combinational logic 1130. In design 1150, registers 1110 and 1115 may be replaced with a single register 1155 in between AND gate 1120 and combinational logic 1130. In an implementation, design 1105 may be optimized to design 1150. In another implementation, design 1150 may be optimized to design 1105. In particular, timing requirements of the design may determine the arrangement of registers in relation to the logic gates of the combinational logic.

Accordingly, certain transformations may involve changing the registers which may act as keypoint nodes for providing data for simulating an inaccessible interconnect. As such, the transformations may need to be tracked such that the correct register may be selected as a keypoint node.

Figure 12:
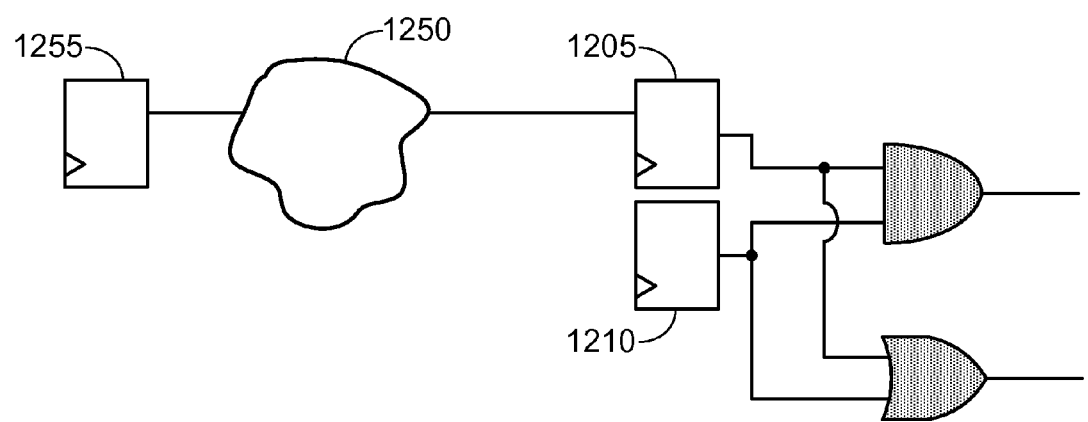
FIG. 12 illustrates an example of a secondary keypoint node in accordance with some implementations.

In some implementations, an interconnect that is an output of an identified keypoint node may not be able to be tapped due to a lack of routing resources. Accordingly, a keypoint node may be identified as another register driving a combinational logic block preceding the register with an output interconnect that is not able to be tapped due to the lack of routing resources. FIG. 12 illustrates an example of a secondary keypoint node in accordance with some implementations.

In FIG. 12, registers 1205 and 1210 may be first identified as keypoint nodes with output interconnects to be tapped to provide data for simulation. However, in FIG. 12, the output interconnect of register 1205 may not be tapped because a lack of routing resources for routing the tap to the debug logic. Accordingly, a secondary keypoint node may need to be identified. For example, in FIG. 12, combinational logic block 1250 may provide an input to register 1205. A keypoint node for combinational logic block 1250 may be register 1255. Accordingly, the output of register 1255 may be tapped to provide data for simulation. Additionally, the derivation method used to determine the values of the interconnects in the simulation may also take into account combinational logic block 1250 and register 1205. That is, combinational logic block 1250 and register 1205 may be added to the truth table, or other derivation method, used in conjunction with the outputs of the secondary keypoint node (i.e., register 1255) and register 1210 in order to provide simulated values.

Figure 13:
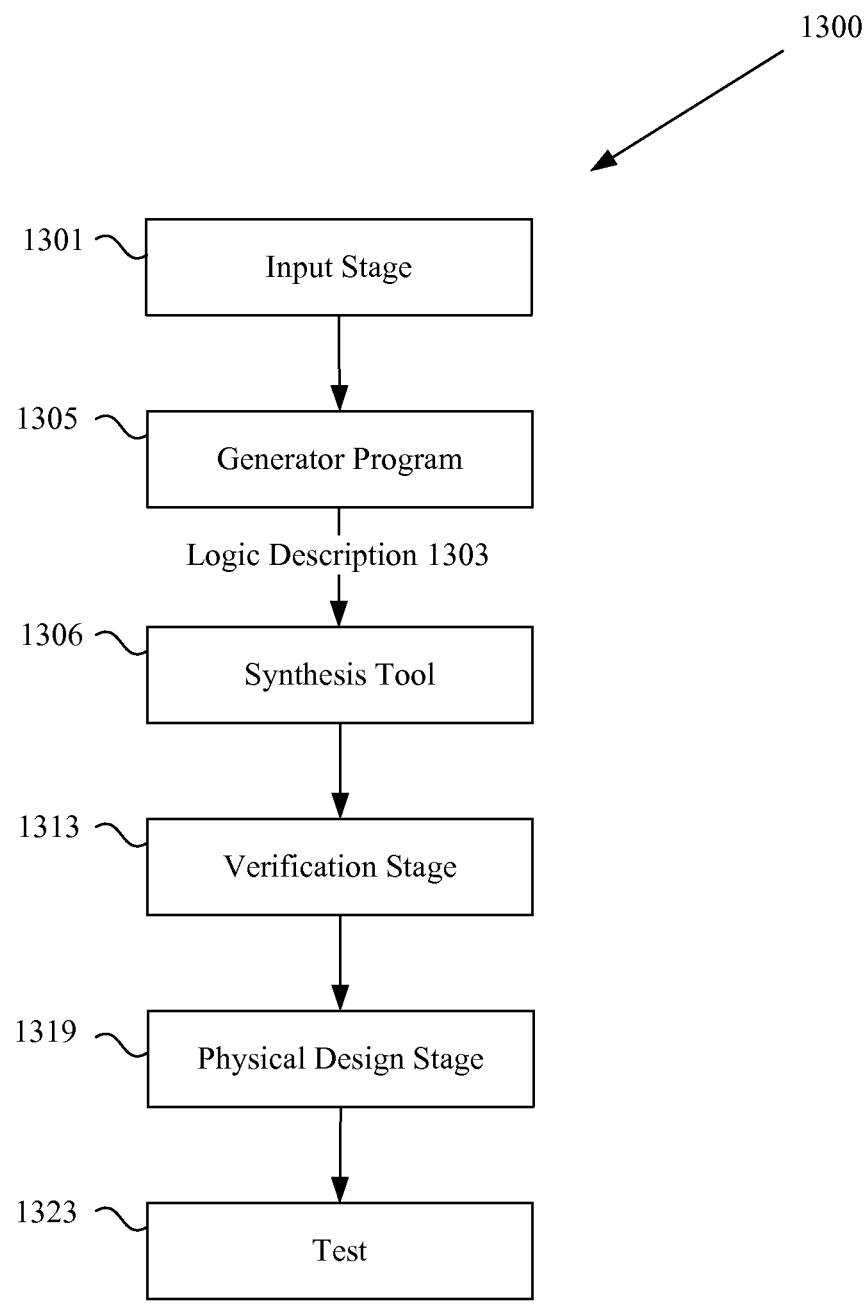
FIG. 13 illustrates a technique for implementing a programmable chip.

As previously discussed, various components may be implemented in a programmable chip. FIG. 13 illustrates a technique for implementing a programmable chip. An input stage 1301 receives selection information typically from a user for logic such as a processor core as well as other components to be implemented on an electronic device. In one example, the input received is in the form of a high-level language program. A generator program 1305 creates a logic description and provides the logic description along with other customized logic to any of a variety of synthesis tools, place and route programs, and logic configuration tools to allow a logic description to be implemented on an electronic device.

In one example, an input stage 1301 often allows selection and parameterization of components to be used on an electronic device. The input stage 1301 also allows configuration of hard coded logic. In some examples, components provided to an input stage include intellectual property functions, megafunctions, and intellectual property cores. The input stage 1301 may be a graphical user interface using wizards for allowing efficient or convenient entry of information. The input stage may also be a text interface or a program reading a data file such as a spreadsheet, database table, or schematic to acquire selection information. The input stage 1301 produces an output containing information about the various modules selected. At this stage, the user may enter security information about individual components that needs to be isolated. For example, different levels of component security and which components are allowed to communicate with each other may be entered.

In typical implementations, the generator program 1305 can identify the selections and generate a logic description with information for implementing the various modules. The generator program 1305 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1305 identifies pointers and provides ports for each pointer. One tool with generator program capabilities is System on a Programmable Chip (SOPC) Builder available from Altera Corporation of San Jose, Calif. The generator program 1305 also provides information to a synthesis tool 1307 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1301, generator program 1305, and synthesis tool 1307 can be separate programs. The interface between the separate programs can be a database file, a log, or simply messages transmitted between the programs. For example, instead of writing a file to storage, the input stage 1301 can send messages directly to the generator program 1305 to allow the generator program to create a logic description. Similarly, the generator program can provide information directly to the synthesis tool instead of writing HDL files. Similarly, input stage 1301, generator program 1305, and synthesis tool 1307 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1307.

A synthesis tool 1307 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1313 typically follows the synthesis stage 1307. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1313, the synthesized netlist file can be provided to physical design tools 1319 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 1323.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1301, the generator program 1305, the synthesis tool 1307, the verification tools 1313, and physical design tools 1319 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 14:
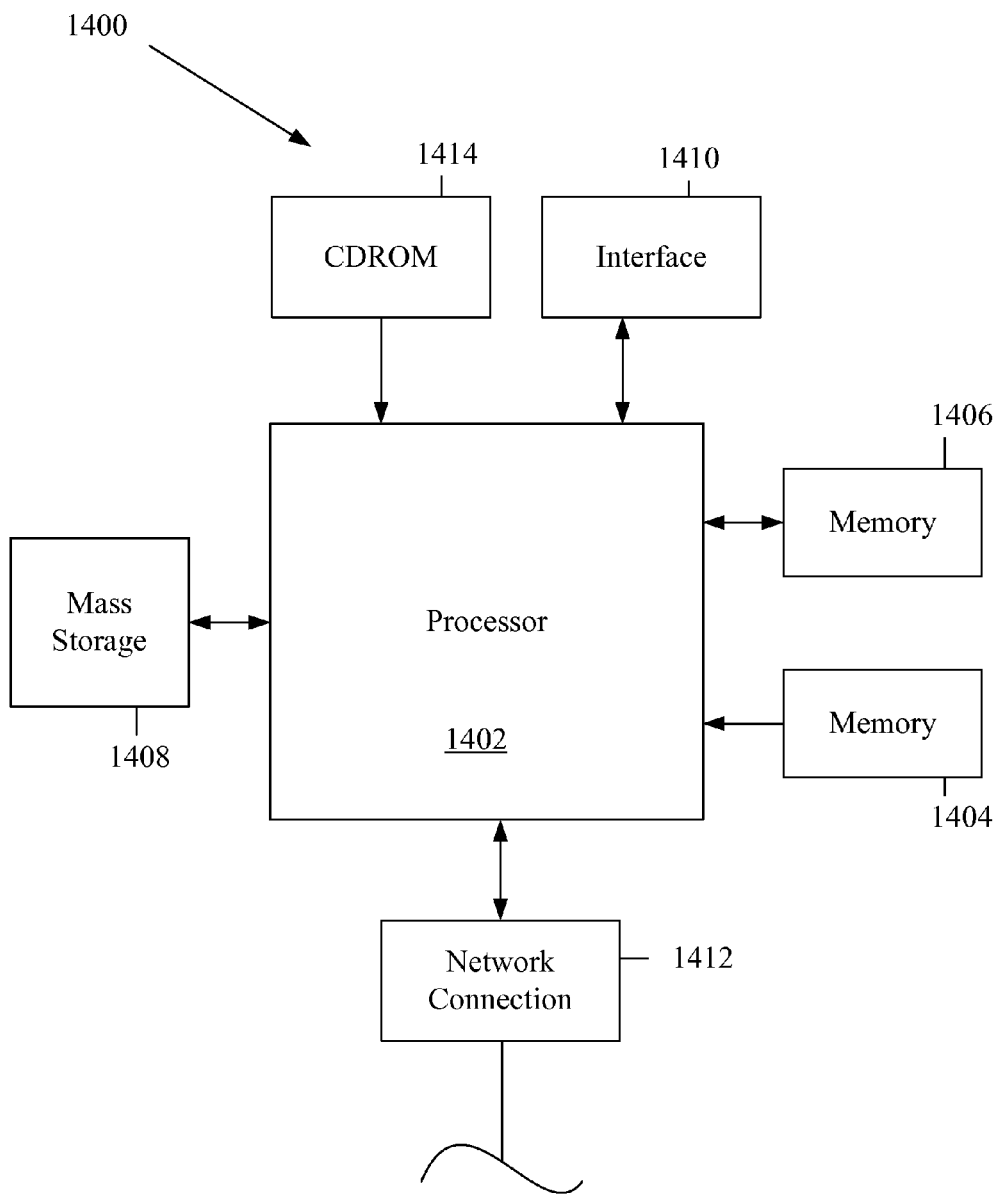
FIG. 14 illustrates one example of a computer system.

FIG. 14 illustrates one example of a computer system. The computer system 900 includes any number of processors 1402 (also referred to as central processing units, or CPUs) that are coupled to devices including memory 1406 (typically a random access memory, or "RAM"), memory 1404 (typically a read only memory, or "ROM"). The processors 1402 can be configured to generate an electronic design. As is well known in the art, memory 1404 acts to transfer data and instructions uni-directionally to the CPU and memory 1406 are used typically to transfer data and instructions in a bi-directional manner.

Both of these memory devices may include any suitable type of the computer-readable media described above. A mass storage device 1408 is also coupled bi-directionally to CPU 1402 and provides additional data storage capacity and may include any of the computer-readable media described above. The mass storage device 1408 may be used to store programs, data and the like and is typically a secondary storage medium such as a hard disk that is slower than memory. The mass storage device 1408 can be used to hold a library or database of prepackaged logic or intellectual property functions, as well as information on generating particular configurations. It will be appreciated that the information retained within the mass storage device 1408, may, in appropriate cases, be incorporated in standard fashion as part of memory 1406 as virtual memory. A specific mass storage device such as a CD-ROM 1414 may also pass data uni-directionally to the CPU.

CPU 1402 is also coupled to an interface 1410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1402 may be a design tool processor. Finally, CPU 1402 optionally may be coupled to a computer or telecommunications network using a network connection as shown generally at 1412. With such a network connection, it is contemplated that the CPU might receive information from the network, or might output information to the network in the course of performing the above-described process steps. It should be noted that the system 1400 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method for simulating a design implemented in a semiconductor device, the method comprising:
   receiving first interconnect data, the first interconnect data indicating a first interconnect of a first logic design implemented within a circuit schematic, wherein the first interconnect is associated with a first combinational logic block;
   identifying, by a processor, a first node for the first combinational logic block, the first node having an output providing an input to the first combinational logic block;
   identifying, by the processor, a second node in a second logic design physically implemented in the semiconductor device, the second node having an output providing an input to a second combinational logic block, wherein the second combinational logic block physically implemented in the semiconductor device is a modified version of the first combinational logic block implemented within the circuit schematic, and the second node providing an input to the second combinational logic block corresponds to the first node providing an input to the first combinational logic block;
   configuring the semiconductor device such that the second logic design is modified to include a tap associated with the output of the second node; and
   simulating a signal associated with the first interconnect of the first logic design implemented within the circuit schematic based on data provided by the tap in the second logic design physically implemented in the semiconductor device.

2. The method of claim 1, wherein the first node and the second node are registers.

3. The method of claim 1, further comprising:
   receiving second interconnect data, the second interconnect data indicating a second interconnect of the first logic design;
   determining, by the processor, that the second interconnect is associated with the first node; and
   simulating a signal associated with the second interconnect in the first logic design based on data provided by the tap in the second logic design.

4. The method of claim 1, wherein the simulation is further based on the first combinational logic block.

5. The method of claim 4, wherein the first interconnect is an output of the first combinational logic block.

6. The method of claim 1, wherein the data provided by the tap is provided by debug logic coupled with the tap.

7. The method of claim 1, wherein the second logic design is a modified version of the first logic design, and the second node in the second logic design corresponds to the first node in the first logic design.

8. The method of claim 7, wherein the second logic design is further mapped to resources of a device, the second node mapped to a first resource, and at least a portion of the second combinational logic block mapped to a second resource, the output of the second node associated with an interconnect between the first resource and the second resource.

9. The method of claim 1, wherein the outputs of the first node and the second node provide the same data to the combinational logic blocks.

10. The method of claim 1, wherein the second combinational logic block is an optimized version of the first combinational logic block.

11. The method of claim 1, wherein the second logic design and the first logic design implement a same functionality, and wherein the second logic design implements the same functionality in the semiconductor device with fewer logical resources than the first logic design implemented in the circuit schematic.

12. A non-transitory computer readable medium having instructions stored thereon for simulating a design implemented in a semiconductor device, the instructions executable by a processor to:
   receive first interconnect data, the first interconnect data indicating a first interconnect of a first logic design implemented within a circuit schematic, wherein the first interconnect is associated with a first combinational logic block;
   identify a first node for the first combinational logic block, the first node having an output providing an input to the first combinational logic block;
   identify a second node in a second logic design physically implemented in the semiconductor device, the second node having an output providing an input to a second combinational logic block, wherein the second combinational logic block physically implemented in the semiconductor device is a modified version of the first combinational logic block implemented within the circuit schematic, and the second node providing an input to the second combinational logic block corresponds to the first node providing an input to the first combinational logic block;
   configure the semiconductor device such that the second logic design is modified to include a tap associated with the output of the second node; and
   simulate a signal associated with the first interconnect of the first logic design implemented within the circuit schematic based on data provided by the tap in the second logic design physically implemented in the semiconductor device.

13. The non-transitory computer readable medium of claim 12, wherein the first node and the second node are registers.

14. The non-transitory computer readable medium of claim 12, the instructions executable by a processor to:
   receive second interconnect data, the second interconnect data indicating a second interconnect of the first logic design;
   determine that the second interconnect is associated with the first node; and
   simulate a signal associated with the second interconnect in the first logic design based on data provided by the tap in the second logic design.

15. The non-transitory computer readable medium of claim 12, wherein the simulation is further based on the first combinational logic block.

16. The non-transitory computer readable medium of claim 15, wherein the first interconnect is an output of the first combinational logic block.

17. The non-transitory computer readable medium of claim 12, wherein the data provided by the tap is provided by debug logic coupled with the tap.

18. The non-transitory computer readable medium of claim 12, wherein the second logic design is a modified version of the first logic design, and the second node in the second logic design corresponds to the first node in the first logic design.

19. The non-transitory computer readable medium of claim 12, wherein the second logic design is further mapped to resources of a device, the second node mapped to a first resource, and at least a portion of the second combinational logic block mapped to a second resource, the output of the second node associated with an interconnect between the first resource and the second resource.

20. The non-transitory computer readable medium of claim 12, wherein the outputs of the first node and the second node provide the same data to the combinational logic blocks.

21. The non-transitory computer readable medium of claim 12, wherein the second combinational logic block is an optimized version of the first combinational logic block.

22. One or more computing devices for simulating a design implemented in a semiconductor device, the one or more computing devices comprising:

one or more processors operable to execute one or more instructions to:

receive first interconnect data, the first interconnect data indicating a first interconnect of a first logic design implemented within a circuit schematic, wherein the first interconnect is associated with a first combinational logic block;

identify, by the processor, a first node for the first combinational logic block, the first node having an output providing an input to the first combinational logic block;

identify, by the processor, a second node in a second logic design physically implemented in the semiconductor device, the second node having an output providing an input to a second combinational logic block, wherein the second combinational logic block physically implemented in the semiconductor device is a modified version of the first combinational logic block implemented within the circuit schematic, and the second node providing an input to the second combinational logic block corresponds to the first node providing an input to the first combinational logic block;

configure semiconductor device such that the second logic design is modified to include a tap associated with the output of the second node; and simulate a signal associated with the first interconnect of the first logic design implemented within the circuit schematic based on data provided by the tap in the second logic design physically implemented in the semiconductor device.

* * * * *